United States Patent [19]

Barthez

[11] Patent Number: 5,434,089
[45] Date of Patent: Jul. 18, 1995

[54] METHOD FOR TESTING THE SHEET RESISTIVITY OF DIFFUSED LAYERS

[75] Inventor: Jean Barthez, Saint Egreve, France

[73] Assignee: SGS-Thomson Microelectronics S.A., Gentilly, France

[21] Appl. No.: 81,545

[22] Filed: Jun. 23, 1993

[30] Foreign Application Priority Data

Jul. 30, 1992 [FR] France ............................ 92/09797

[51] Int. Cl.⁶ .......................................... H01L 21/66
[52] U.S. Cl. ........................................ 437/8; 437/153
[58] Field of Search .................... 437/8, 153, 152; 148/DIG. 30, DIG. 40

[56] References Cited

U.S. PATENT DOCUMENTS

| | | | |
|---|---|---|---|
| 3,134,077 | 5/1964 | Hutchins, IV et al. | 437/8 |
| 3,839,103 | 11/1979 | Nienhuis et al. | 437/153 |
| 4,151,019 | 4/1979 | Tokumaru et al. | 437/153 |
| 4,257,825 | 5/1981 | Schaumburg | 437/8 |
| 4,440,799 | 4/1984 | Faith, Jr. . | |
| 4,706,015 | 11/1987 | Chen . | |
| 5,010,029 | 4/1991 | Liu et al. | 437/8 |
| 5,256,577 | 11/1993 | Pluntke et al. | 437/8 |

FOREIGN PATENT DOCUMENTS

59-201436 11/1984 Japan .................. 148/DIG. 146

OTHER PUBLICATIONS

RCA Review, Dec. 1963 pp. 528–533.
Solid State Technology, vol. 26, No. 8, Aug. 1983, Washington, US, pp. 159–167, Gruber, "Ion Implant Testing for Production Control".
Solid State Technology, vol. 27, No. 12, Dec. 1984, Washington, US, pp. 125–132, Brennan & Dickey, "Determination of Diffusion Characteristics Using Two- and Four-Point Probe Measurements".

*Primary Examiner*—Olik Chaudhuri
*Assistant Examiner*—S. Mulpuri
*Attorney, Agent, or Firm*—Wolf, Greenfield & Sacks

[57] ABSTRACT

A method and apparatus for testing the sheet resistivity of the diffused layers includes adding to each wafer batch, withstanding a doping and diffusion process, at least one reference wafer subject to the same process, and carrying out measurements in a plurality of areas of each reference wafer. Prior to each doping and diffusion step, a window is opened in each measurement area of the reference wafer so that the doping and diffusion operation is achieved only in a portion of the area where the measurement is subsequently carried out.

23 Claims, 2 Drawing Sheets

METHOD FOR TESTING THE SHEET RESISTIVITY OF DIFFUSED LAYERS

BACKGROUND OF THE INVENTION

1. Field of the Invention

The present invention relates to the manufacturing of semiconductor components, and more particularly to the manufacturing of integrated circuits.

2. Discussion of the Related Art

The manufacturing of such components involves the use of a wafer made of a semiconductor material, usually silicon, but may be for example gallium arsenide, in which various successive masking and doping steps are carried out for providing various N-type or P-type regions.

Such processes are crucial and can vary as a function of numerous parameters. Hence, during manufacturing, checking of the physical characteristics of each N or P region formed must be made in order to detect any possible deviation of the manufacturing process.

Doping steps generally include a dopant implantation and/or prediffusion step followed by a dopant diffusion step in an oven. This diffusion step is carried out while a large number of wafers, for example 200, are simultaneously placed in the oven in boats including from 25 up to 50 wafers. In order to carry out checking, reference wafers that withstood an identical initial process are placed in the diffusion oven at the same time as the component wafers on which the areas occupied by the different layers are suitably localized. Then, the sheet resistivity (also called surface resistivity or resistivity per square) is measured according to the conventional "Four Probes" method (refer to L. B. Valdes, "Resistivity Measurement on Germanium for Transistors" Proc IRE, Feb. 1954, pp. 420–427). This resistivity is equal to the mean resistivity of the layer divided by its thickness and is expressed in ohms per square.

The conventional measurement device includes a head with four co-linear points separated by an arbitrary distance, frequently equal to $\frac{1}{2}\pi$ cm, that is, 1.59 mm in commercialized devices, which simplifies certain mathematic expressions. A current I is injected between two points (generally, the two outermost points) and voltage V is measured between the two other points. The sheet resistivity is then equal to KV/I where K is a factor that depends on the shape of the sample. When the sample is an infinite plane surface and when the current is injected through the two outermost points, K s conventionally equal to $\pi/Ln2 = 4.53$. This case corresponds with a good approximation to the case when measurement is carried out in the middle of a wafer since a wafer having a 100-mm diameter can be considered as an infinite plane with respect to the 1.59-mm separation between the points. When measurement is carried out close to the wafer's edge, appropriate correction factors must be calculated and applied (refer to "Four Point Probe Correction Factors for Use in Measuring Large Diameter Doped Semiconductor Wafers" by David S. Perloff, J.E.C.S., Nov. 1976).

The conventional equipment includes an x-y movable table coupled to a computer and to a measurement apparatus and which provides a cartography of a reference wafer and allows for drawing curves of points having the same sheet resistivity. Such equipment indicates with a high accuracy the sheet resistivity value of a diffused layer and the uniformity of this resistivity. The equipment is used only during the start-up phase of a manufacturing process or for sophisticated checking steps.

For current manufacturing checking steps, five measurements only are carried out on a wafer, namely, one measurement in middle of the wafer and four measurements at the periphery of the four quadrants by using more or less automated apparatuses in order to obtain an automatic measurement, a display of the results, a mean difference value, and an automatic displacement of the points onto the five measurement areas, with application of suitable correction factors.

Those checking steps are used, as above indicated, with reference wafers in which diffusion is carried out on the whole wafer surface. Since, for monitoring the diffusion step of wafer batches, generally three reference wafers are used (one in the middle of the batch an one close to each extremity of this batch), this requires the provision of 300 reference wafers for manufacturing equipment in which each batch includes 200 wafers and where 100 batches per month are fabricated. This results in non-negligible costs, as the present trend is to use wafers having increasingly large diameters, commonly 100, 150 or 200 mm, which increases the cost of a wafer.

In order to reduce this cost and loss of material, it has been devised in the prior art to level the surface of a reference wafer after the diffusion step and checking steps so as to reuse it. However, this operation is relatively expensive and critical and cannot be repeated very frequently due to the fact that the thickness of a silicon wafer is usually within the range of 0.3 to 0.5 mm.

SUMMARY OF THE INVENTION

An object of the invention is to provide a method for reducing the number of reference wafers used with successive manufacturing batches.

Another object of the invention is to provide such a method that does not involve the implementation of apparatuses different from those presently used.

To achieve this object, the invention provides a method for testing the sheet resistivity of diffused layers which includes inserting in each wafer batch, withstanding a doping and diffusion process, at least one reference wafer subject to the same process, this reference wafer being initially doped according to a substantially lower doping level and/or according to a conductivity type opposite to the conductivity type of the layer to be tested; and carrying out point test measurements of the diffused layer in a plurality of areas of each reference wafer. Prior to each doping and diffusion step, a window is opened in each measurement area of the reference wafer so that the doping and diffusion operation is achieved only in a portion of each area where this measurement is subsequently carried out.

According to an embodiment of the invention, the measurement areas include a central area and four areas distributed in four quadrants of the wafer.

According to an embodiment of the invention, the wafers are made of silicon and the windows are opened in a silicon oxide layer that is formed on at least one main surface of the reference wafer.

The foregoing and other objects, features, aspects and advantages of the invention will become apparent from the following detailed description of the present invention when taken in conjunction with the accompanying drawings.

DETAILED DESCRIPTION

Figure 1A:
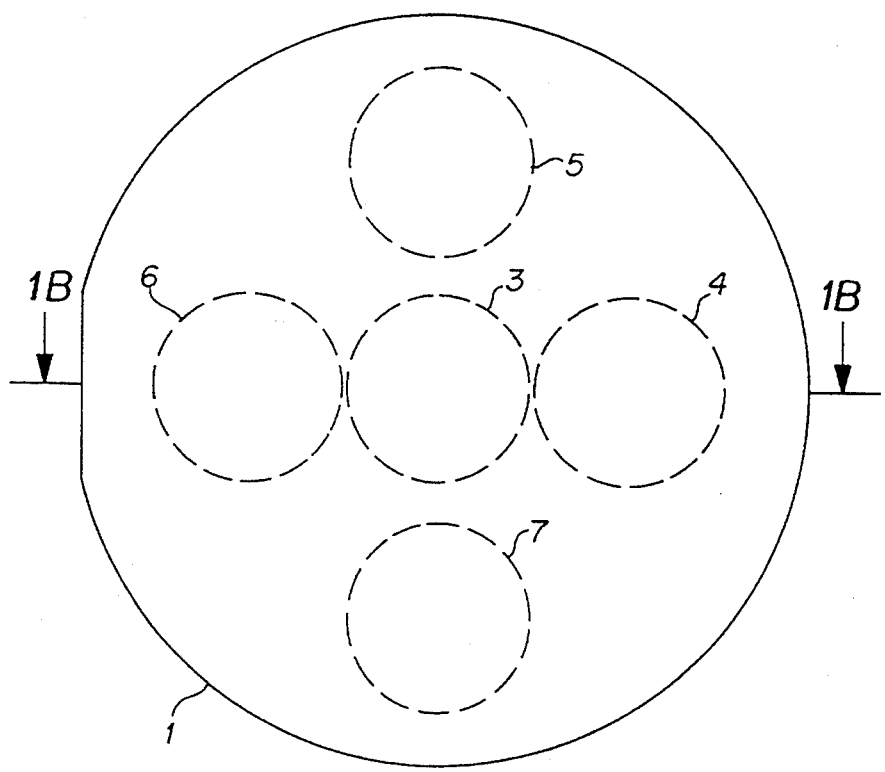
FIGS. 1A and 1B are a front view and a cross-sectional view, along line BB of FIG. 1A, respectively, illustrating a conventional test method.
Figure 1B:
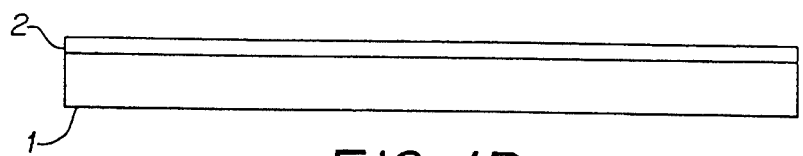

FIGS. 1A and 1B are respectively a front view and a cross-sectional view of a reference wafer useful for describing a conventional test method.

According to this method, one starts from a wafer 1 in which is carried out on a whole surface (or on both surfaces) a diffusion 2 identical to the diffusion to be tested. Preferably, the wafer has a conductivity type opposite the conductivity of the diffusion whose characteristics are to be tested. The wafer can also be of the same conductivity type as that of the diffused layer, but then with a much lower doping level.

Then, tests are carried out in various areas of the wafer, for example, in a central area 3 and in lateral areas 4, 5, 6 and 7.

Figure 2A:
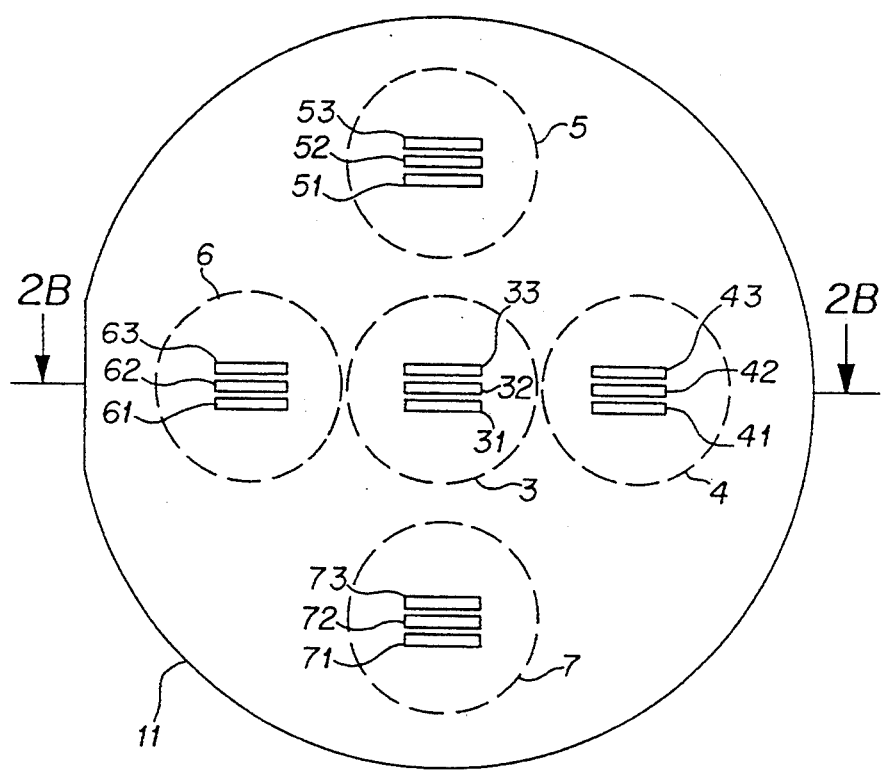
FIGS. 2A and 2B are a front view and a cross-sectional view, along line BB of FIG. 2A, respectively, illustrating a test method according to the invention.
Figure 2B:
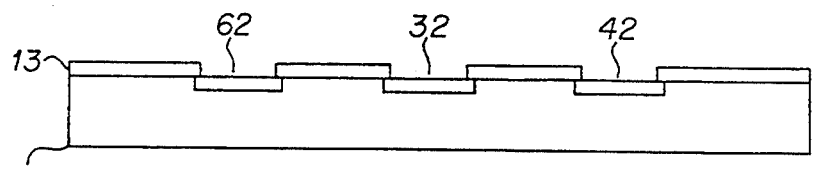

FIGS. 2A and 2B illustrate the method according to the invention. As in the prior art, one starts from a reference wafer 11. However, whereas implantation or prediffusion steps are carried out in the reference wafers and in wafers being manufactured, those implantation and prediffusion operations are carried out in the reference wafers only within a set of selected places respectively contained in each area 3, 4, 5, 6 and 7. For example, during a first utilization of a reference wafer, the latter is coated with a masking layer, for example an $SiO_2$ layer 13 when the wafer is made of silicon, and first windows 31, 41, 51, 61 and 71, through which are carried out doping steps, are opened in this layer.

Once the diffused areas in those first windows have been tested, adjacent windows 32, 42, 52, 62, 72, etc, are opened. This second opening step may be preceded by the closing of the preceding windows, for example in the case of silicon, by depositing or growing a new oxide layer. FIG. 2A illustrates only three successive windows per area. In practice, given the conventional separation between the probe points and the required surfaces, it is possible to open windows, each having a size of substantially 1.59×10 mm. This allows, for a wafer having a 100-mm diameter, to form between four and eight successive windows disposed side by side in each area. The separation between each window is selected, taking into account that, at each diffusion step, a lateral diffusion is generated. Preferably, the windows are disposed side by side, for example 1 mm apart one from another, and the adjacent windows are sequentially used from an outermost window to the farthest one therefrom so that the various annealing steps carried out in an area where a first diffusion was made do not allow the lateral extension of this diffusion to join the last window to be tested.

Known calculation means allow one to determine the sheet resistivity of the area formed in each window with an accuracy that is equal to that obtained in the case of a full wafer diffusion.

Then, once all the selected windows have been used, it is possible, as it is the case with the conventional methods, to proceed to a superficial levelling of the wafer in order to eliminate the diffused regions and to resume the operation.

As is apparent to those skilled in the art, various modifications can be made to the above disclosed preferred embodiments, and in particular in the shapes, number and arrangement of the successive windows opened in each of the selected areas. During each probe step, instead of using one measurement head that is displaced from one measurement area to another, an assembly of five heads, performing simultaneous measurements, can be used.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for testing the sheet resistivity of diffused layers in semiconductor component wafers produced in batches, comprising the steps of:
   providing at least one reference wafer that is separate from the semiconductor component wafers;
   opening a first plurality of windows to expose a first plurality of regions in the at least one reference wafer, each of the first plurality of windows being opened in one of a plurality of areas of the at least one reference wafer;
   doping the at least one reference wafer only within the first plurality of windows to produce first diffused layer sections within the at least one reference wafer, the first diffused layer sections having sheet resistivities;
   measuring the sheet resistivities of the first diffused layer sections;
   opening a second plurality of windows to expose a second plurality of regions that were not exposed by the opening of the first plurality of windows, each of the second plurality of windows being opened in one of the plurality of areas;
   doping the at least one reference wafer only within the second plurality of windows to produce second diffused layer sections within the at least one reference wafer, the second diffused layer sections having sheet resistivities; and
   measuring the sheet resistivities of the second diffused layer sections.

2. A method as claimed in claim 1 wherein the step of providing at least one reference wafer includes the step of providing at least one reference wafer having a lower doping level than a doping level resulting from the step of doping the at least one reference wafer only within the first plurality of windows.

3. A method as claimed in claim 1 wherein the step of providing at least one of reference wafer includes the step of providing at least one reference wafer having a conductivity type opposite to a conductivity type resulting from the step of doping the at least one reference wafer only within the first plurality of windows.

4. A method as claimed in claim 1, further comprising the step of, before the step of doping the at least one reference wafer only within the second plurality of windows, closing the first plurality of windows.

5. A method as claimed in claim 1 wherein the step of opening the first plurality of windows includes the step of opening the first plurality of windows in a central area and four surrounding areas.

6. A method as claimed in claim 1 wherein the step of providing at least one reference wafer includes the step of providing at least one reference wafer made of silicon.

7. A method as claimed in claim 6 further comprising the step of, after the step of providing at least one reference wafer, depositing a layer of silicon oxide on a surface of the at least one reference wafer.

8. A method as claimed in claim 7 wherein the step of opening the first plurality of windows includes the step of opening the first plurality of windows within the silicon oxide layer.

9. A method for testing the sheet resistivity of a diffused layer in a semiconductor component wafer, comprising the steps of:
   providing a reference wafer that is separate from the semiconductor component wafer;
   opening a first plurality of windows to expose a first plurality of regions in the at lest one reference wafer, each of the first plurality of windows being opened in one of a plurality of areas of the at least one reference wafer;
   doping the reference wafer only within the first plurality of windows to produce first diffused layer sections only within the plurality of areas, the first diffused layer sections having sheet resistivities;
   measuring the sheet resistivities of the first diffused layer sections;
   opening a second plurality of windows to expose a second plurality of regions that were not exposed by the opening of the first plurality of windows, each of the second plurality of windows being opened in one of the plurality of areas;
   doping the reference wafer only within the second plurality of windows to produce second diffused layer sections only within the plurality o areas within the reference wafer, the second diffused layer sections having sheet resistivities; and
   measuring the sheet resistivities of the second diffused layer sections.

10. A method as claimed in claim 9 wherein the step of providing a reference wafer includes the step of providing a reference wafer having a lower doping level than a doping level resulting from the step of doping the reference wafer only within the first plurality of windows.

11. A method as claimed in claim 9 wherein the step of providing a reference wafer includes the step of providing a reference wafer having a conductivity type opposite to a conductivity type resulting from the step of doping the reference wafer only within the first plurality of windows.

12. A method as claimed in claim 9 further comprising the step of, before the step of doping the reference wafer only within the second plurality of windows, closing the first plurality of windows.

13. A method as claimed in claim 9 wherein the step of opening the first plurality of windows includes the step of opening a first plurality of windows in a central area and four surrounding areas.

14. A method as claimed in claim 9 wherein the step of providing the reference wafer includes the step of providing a reference wafer made of silicon.

15. A method as claimed in claim 14 further comprising the step of, after the step of providing the reference wafer, depositing a layer of silicon oxide on a surface of the reference wafer.

16. A method as claimed in claim 15 wherein the step of opening the first plurality of windows includes the step of opening the first plurality of windows within the silicon oxide layer.

17. A method for testing the sheet resistivity of diffused layers in semiconductor component wafers produced in batches, comprising the steps of:
   A. providing at least one reference wafer that is separate from the semiconductor component wafers;
   B. opening a first window to expose a first region in the at least one reference wafer;
   C. doping the at least reference wafer within the first window to produce a first diffused layer section within the at least one reference wafer, the first diffused layer section having a sheet resistivity;
   D. measuring the sheet resistivity of the first diffused layer section;
   E. opening a second window to expose a second region in the at least one reference wafer that was not exposed by the opening of the first window;
   F. doping the at least one reference wafer within the second window to produce a second diffused layer section within the at least one reference wafer, the second diffused layer second having a sheet resistivity; and
   G. measuring the sheet resistivities of the second diffused layer section.

18. The method of claim 17, further comprising the step of, before the step of doping the at least one reference wafer within the second window, closing the first window.

19. The method of claim 17, wherein steps B, C, E, and F are performed on a first surface of the at least one reference wafer, and wherein the method further comprises the steps of:
   removing the first surface of the at least one reference wafer to expose a second surface;
   opening a third window on the second surface of the at least one reference wafer;
   doping the at least one reference wafer within the third window to produce a third diffused layer section within the at least one reference wafer, the third diffused layer section having a sheet resistivity; and
   measuring the sheet resistivity of the third diffused layer section.

20. A method for testing the sheet resistivity of diffusion layers in at least two batches of semiconductor component wafers, the method comprising the steps of:
   A. providing a test wafer;
   B. opening a first measurement area to expose a first region on the test wafer;
   C. inserting the test wafer into a first batch of semiconductor wafers;
   D. doping the test wafer within the first measurement area to produce a first diffused layer section within the test wafer, the first diffused layer section having a sheet resistivity;
   E. measuring the resistivity of the first diffused layer section;
   F. opening a second measurement area to expose a second region on the test wafer that was not exposed by the opening of the first measurement area;
   G. inserting the test wafer into a second batch of semiconductor wafers;

H. doping the test wafer within the second measurement area to produce a second diffused layer section within the test wafer, the second diffused layer section having a sheet resistivity;

I. measuring the resistivity of the second diffused layer section.

21. The method of claim 20 wherein steps B, D, F, and H are performed on a first surface of the test wafer, and wherein the method further comprises the steps of:

J. removing the first surface of the test wafer to expose a second surface of the test wafer;

K. opening third measurement area on the second surface of the test wafer;

L. inserting the test wafer into a third batch of semiconductor wafers;

M. doping the test wafer within the third measurement area to produce a third diffused layer section within the test wafer, the third diffused layer section having a sheet resitivity;

N. measuring the resitivity of the third diffused layer section.

22. The method of claim 20 wherein the step of providing a test wafer includes providing a test wafer that is separate from the semiconductor component wafers.

23. The method of claim 20 wherein the first batch of wafers is subjected to a first doping process and the second batch of wafers is subjected to a second doping process, and wherein:

step D includes subjecting the test wafer to the first doping process in the first measurement area; and step H includes subjecting the test wafer to the second doping process in the second measurement area.

* * * * *